(12) United States Patent
Henson et al.

(10) Patent No.: US 7,745,855 B2
(45) Date of Patent: Jun. 29, 2010

(54) SINGLE CRYSTAL FUSE ON AIR IN BULK SILICON

(75) Inventors: William K. Henson, Beacon, NY (US); Deok-Kee Kim, Bedford Hills, NY (US); Chandrasekharan Kothandaraman, Hopewell Junction, NY (US); Byeongju Park, Plainview, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 11/867,268

(22) Filed: Oct. 4, 2007

(65) Prior Publication Data

US 2009/0090993 A1   Apr. 9, 2009

(51) Int. Cl.
*H01L 27/10* (2006.01)
(52) U.S. Cl. ............... 257/209; 257/529; 257/E21.592
(58) Field of Classification Search ............... 257/529, 257/530, 50, 209, E23.147, E23.149, E21.592
See application file for complete search history.

(56) References Cited

U.S. PATENT DOCUMENTS

| | | | |
|---|---|---|---|
| 5,903,041 A | 5/1999 | LaFleur et al. | |
| 6,274,440 B1 | 8/2001 | Arndt et al. | |
| 6,368,902 B1 | 4/2002 | Kothandaraman et al. | |
| 6,624,499 B2 | 9/2003 | Kothandaraman et al. | |
| 6,933,591 B1 * | 8/2005 | Sidhu et al. | 257/665 |
| 2002/0011645 A1 | 1/2002 | Bertin et al. | |
| 2006/0197179 A1 * | 9/2006 | Park et al. | 257/529 |
| 2009/0051003 A1 * | 2/2009 | Cheng et al. | 257/529 |

* cited by examiner

*Primary Examiner*—Davienne Monbleau
*Assistant Examiner*—Dilinh P Nguyen
(74) *Attorney, Agent, or Firm*—Joseph P. Abate; Howard M. Cohn

(57) ABSTRACT

An integrated eFUSE device is formed by forming a silicon "floating beam" on air, whereupon the fusible portion of the eFUSE device resides. This beam extends between two larger, supporting terminal structures. "Undercutting" techniques are employed whereby a structure is formed atop a buried layer, and that buried layer is removed by selective etching. Whereby a "floating" silicide eFUSE conductor is formed on a silicon beam structure. In its initial state, the eFUSE silicide is highly conductive, exhibiting low electrical resistance (the "unblown state of the eFUSE). When a sufficiently large current is passed through the eFUSE conductor, localized heating occurs. This heating causes electromigration of the silicide into the silicon beam (and into surrounding silicon, thereby diffusing the silicide and greatly increasing its electrical resistance. When the current source is removed, the silicide remains permanently in this diffused state, the "blown" state of the eFUSE.

8 Claims, 14 Drawing Sheets

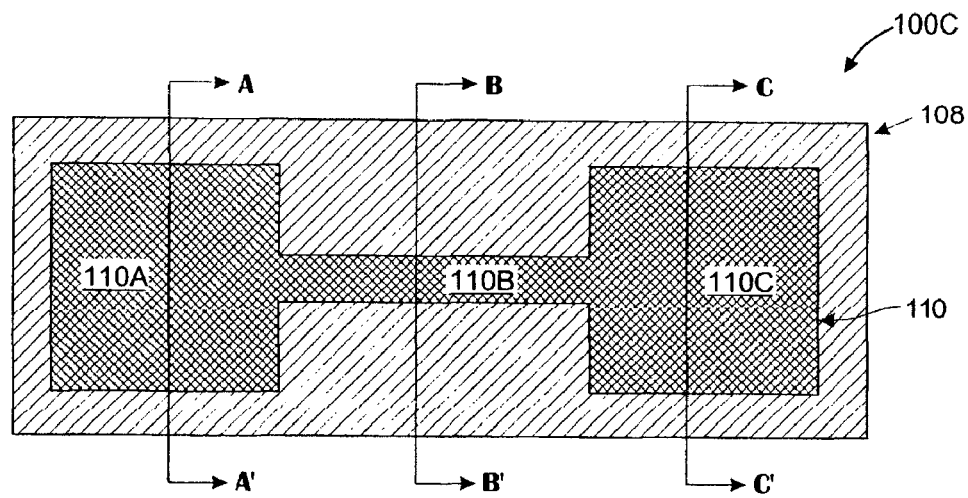
FIG. 1C
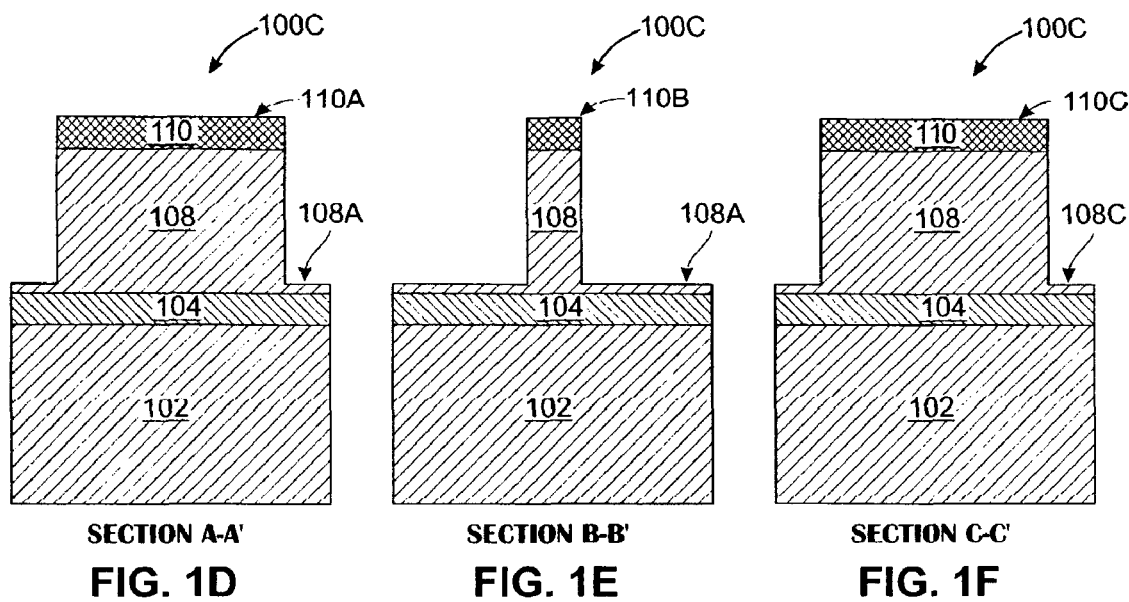
SECTION A-A'
FIG. 1D
SECTION B-B'
FIG. 1E
SECTION C-C'
FIG. 1F

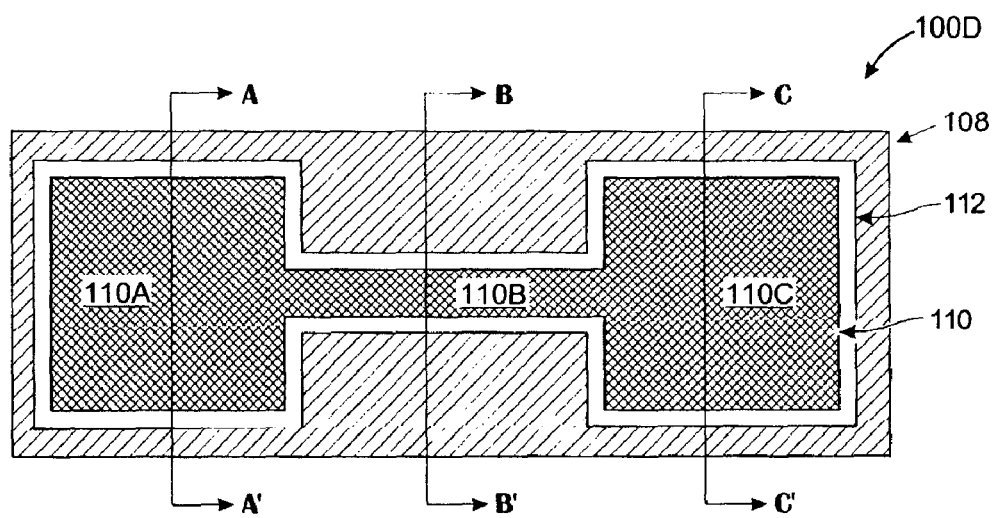
FIG. 1G
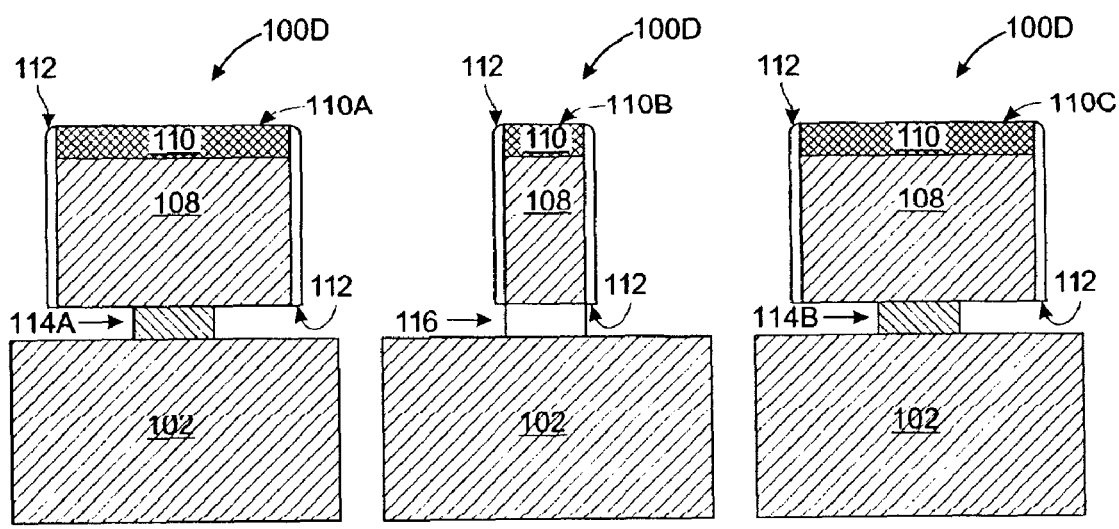
SECTION A-A'
FIG. 1H
SECTION B-B'
FIG. 1I
SECTION C-C'
FIG. 1J

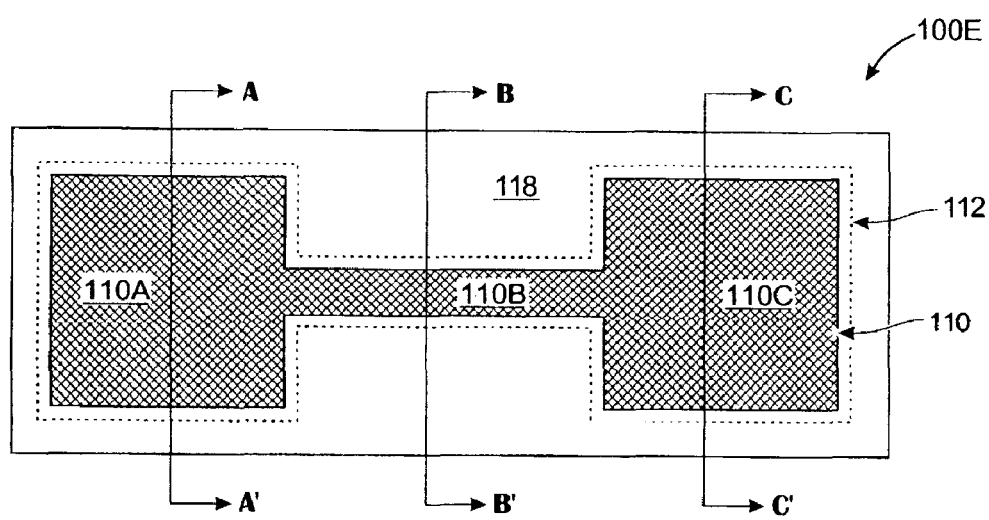
FIG. 1K
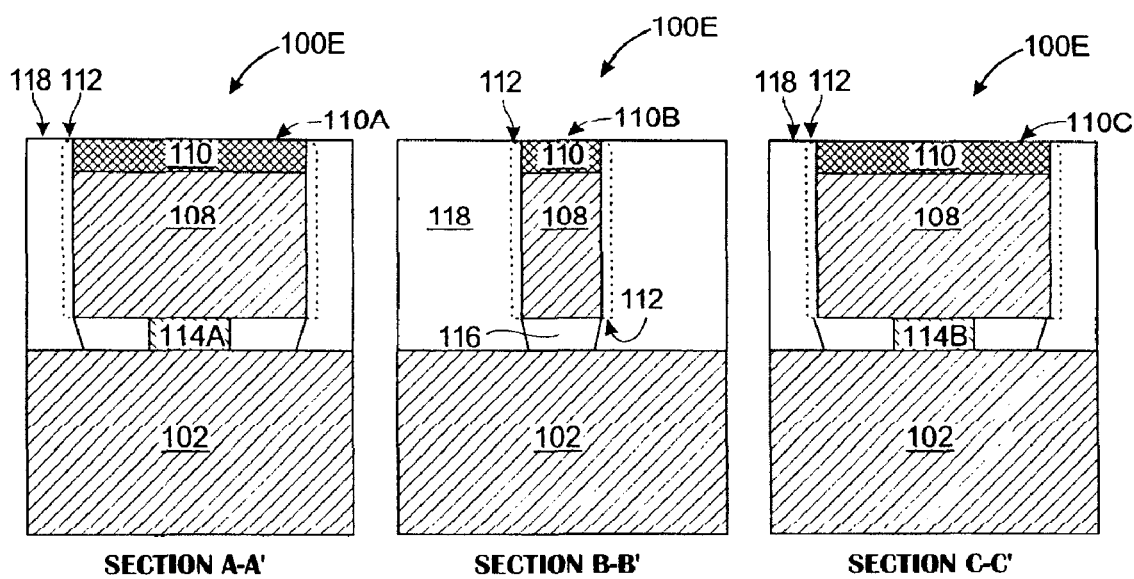
SECTION A-A'
FIG. 1L
SECTION B-B'
FIG. 1M
SECTION C-C'
FIG. 1N

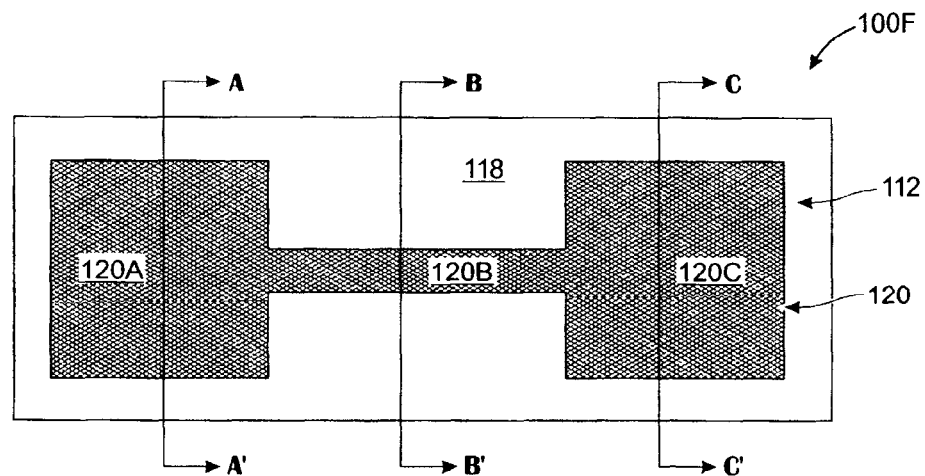
FIG. 1P
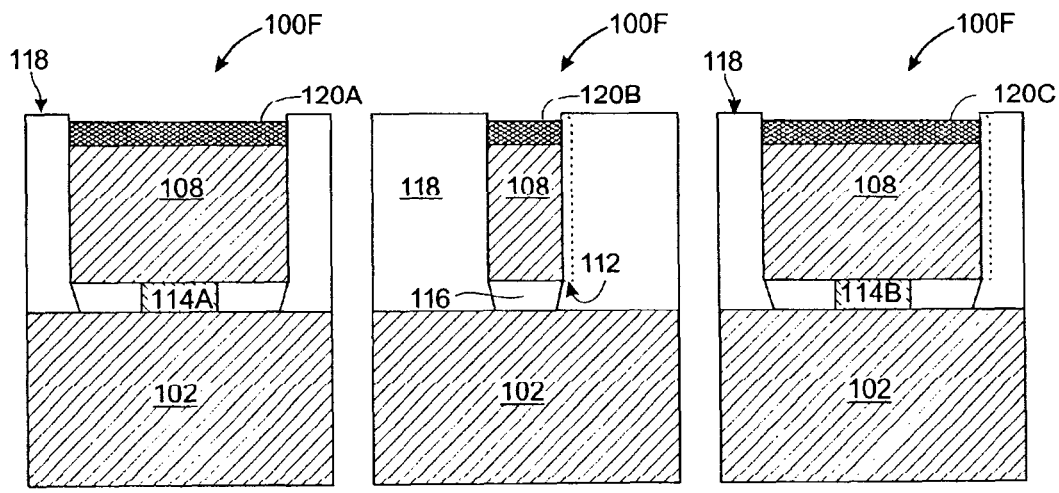
SECTION A-A'
FIG. 1Q
SECTION B-B'
FIG. 1R
SECTION C-C'
FIG. 1S

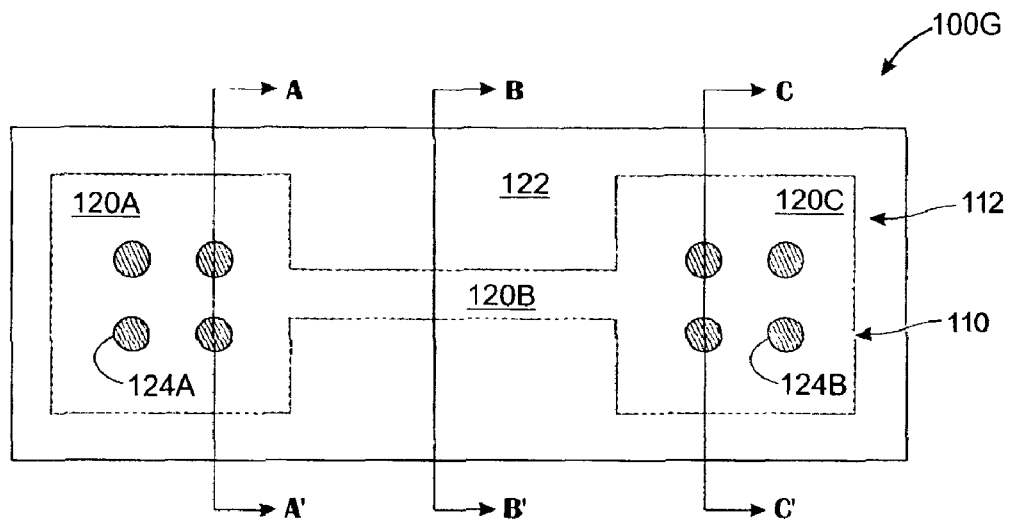
FIG. 1T
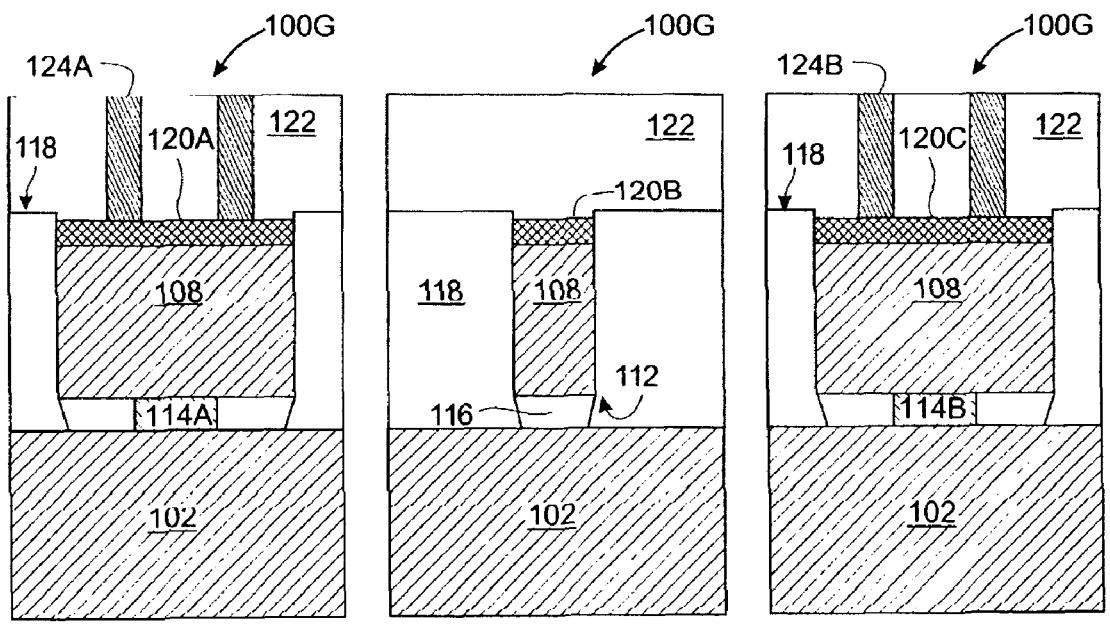
SECTION A-A'
FIG. 1U
SECTION B-B'
FIG. 1V
SECTION C-C'
FIG. 1W

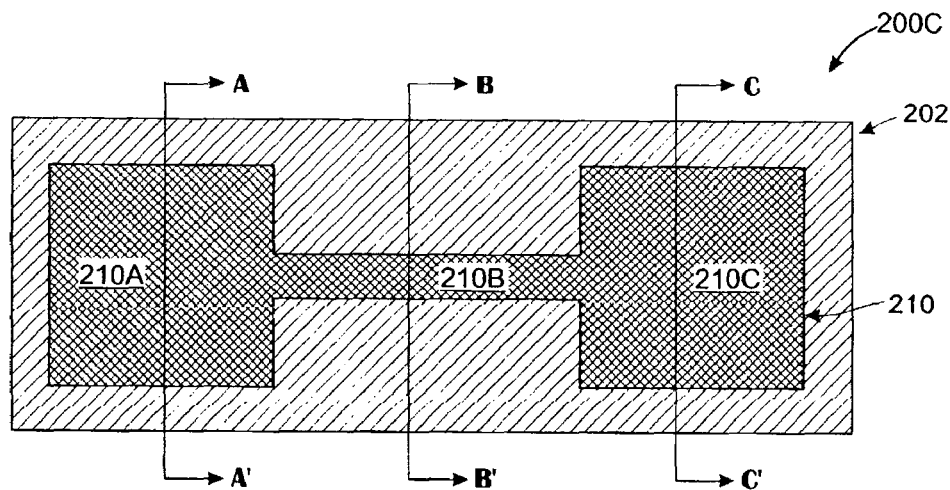
FIG. 2C
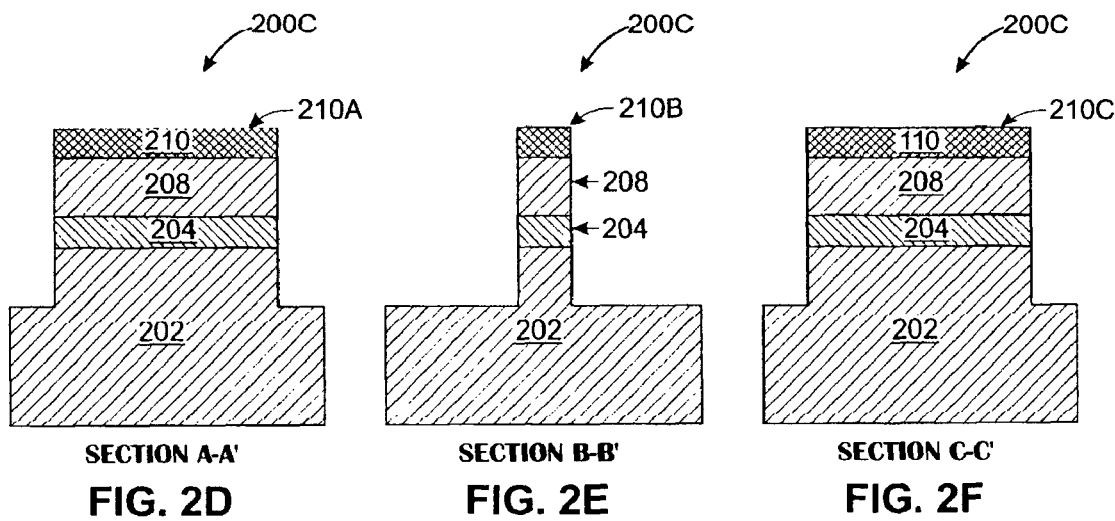
SECTION A-A'
FIG. 2D
SECTION B-B'
FIG. 2E
SECTION C-C'
FIG. 2F

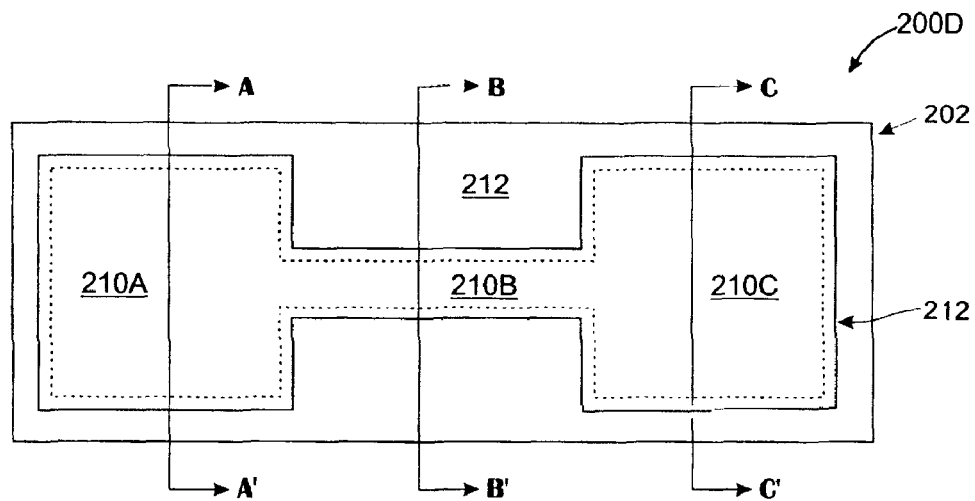
FIG. 2G
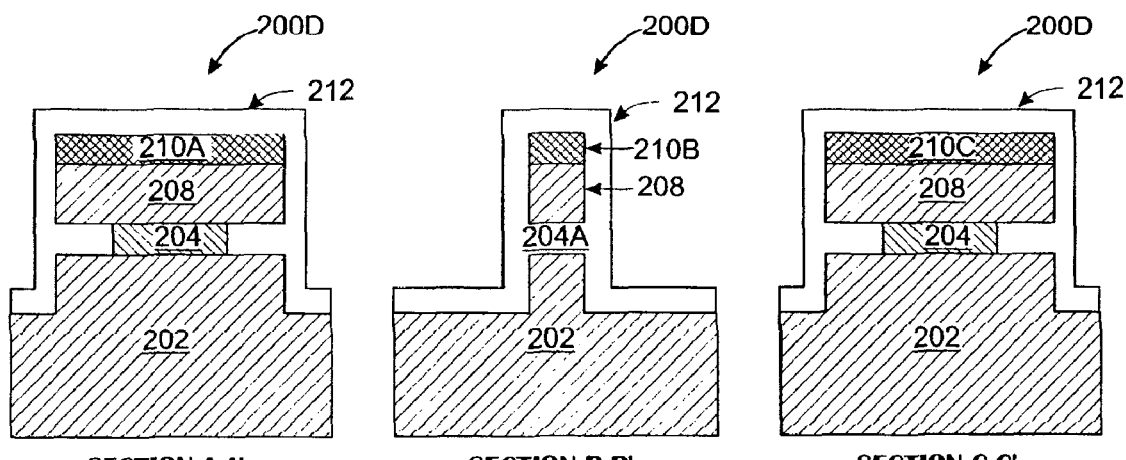
SECTION A-A'
FIG. 2H
SECTION B-B'
FIG. 2I
SECTION C-C'
FIG. 2J

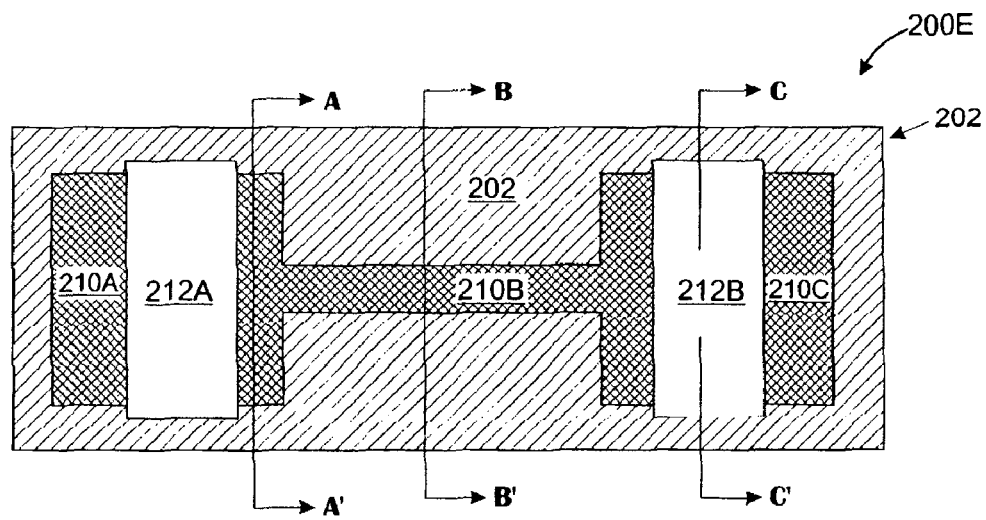
FIG. 2K
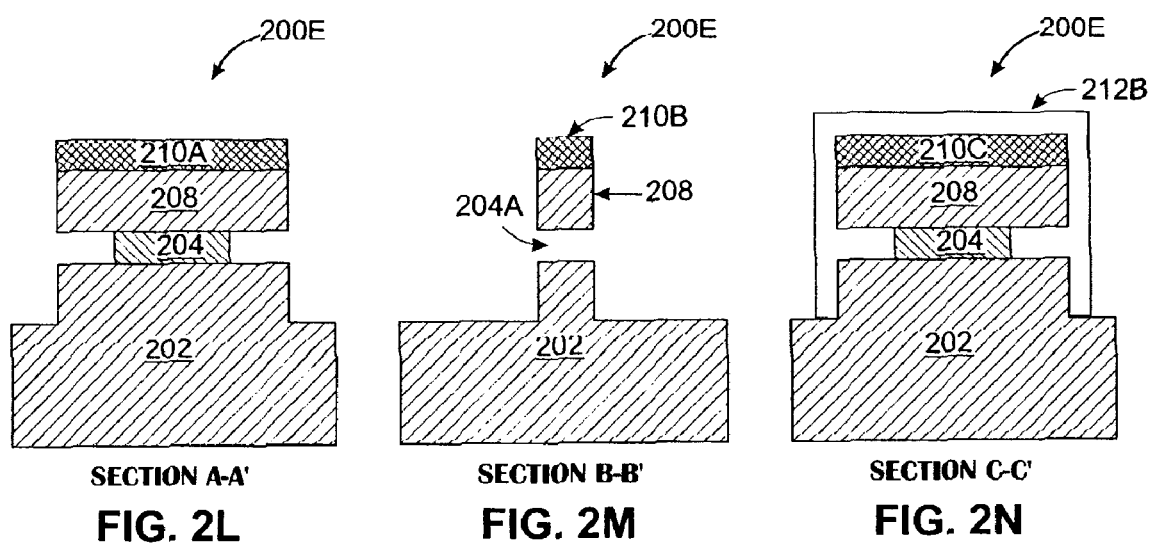
SECTION A-A'
FIG. 2L
SECTION B-B'
FIG. 2M
SECTION C-C'
FIG. 2N

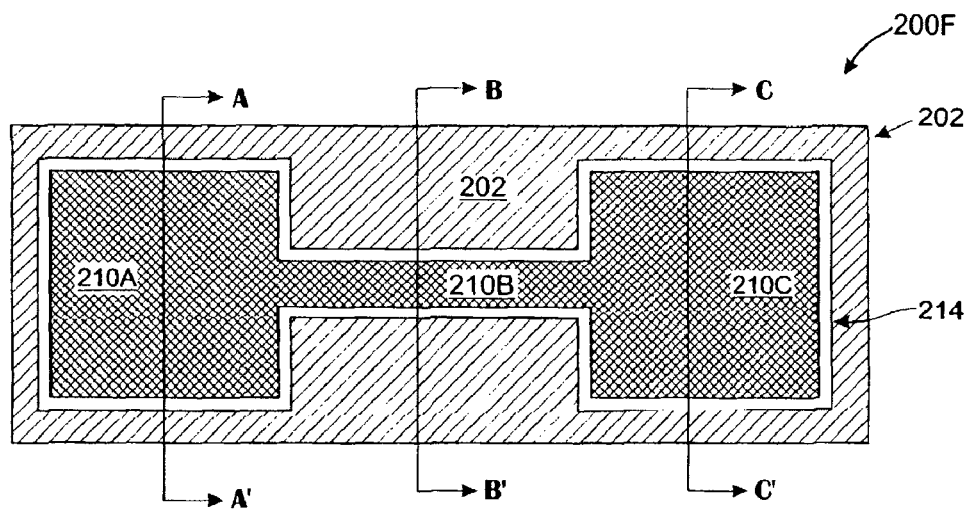
FIG. 2P
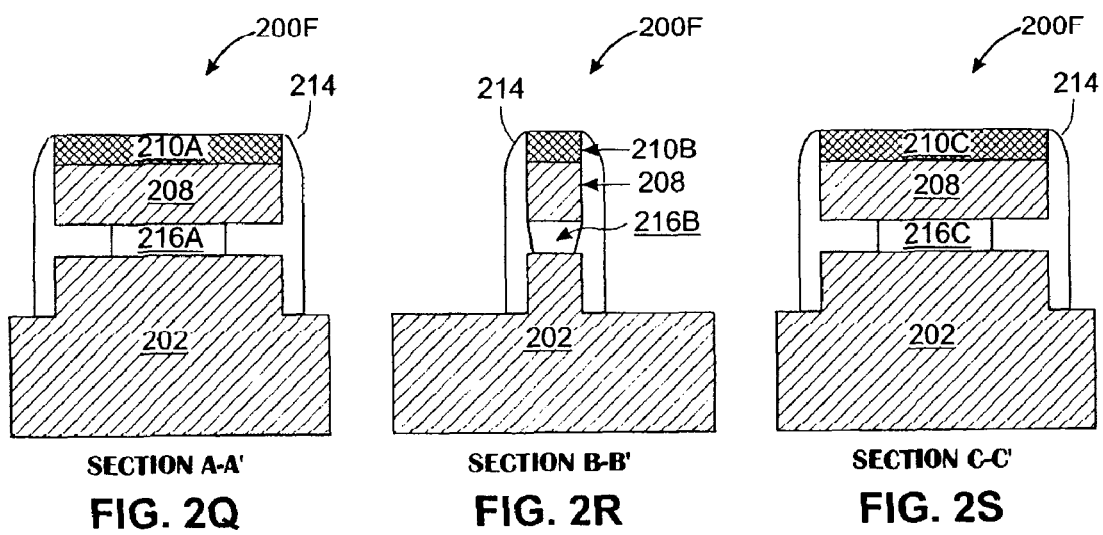
SECTION A-A'
FIG. 2Q
SECTION B-B'
FIG. 2R
SECTION C-C'
FIG. 2S

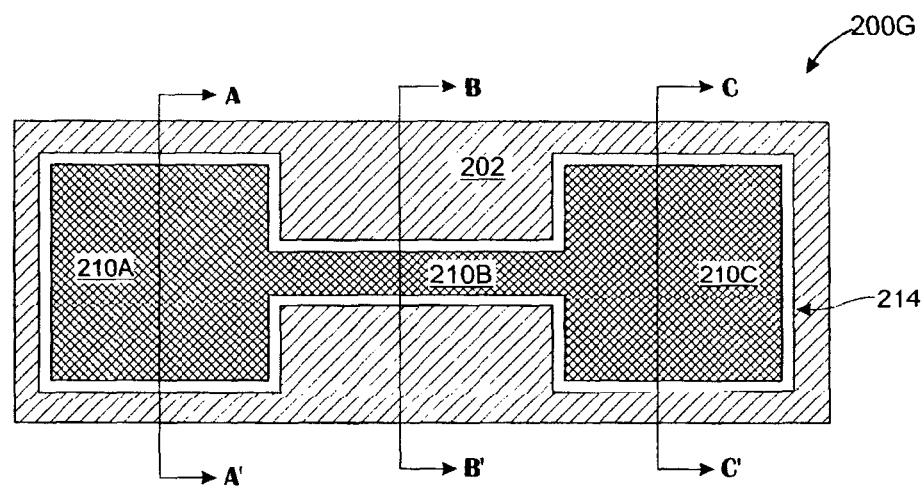
FIG. 2T
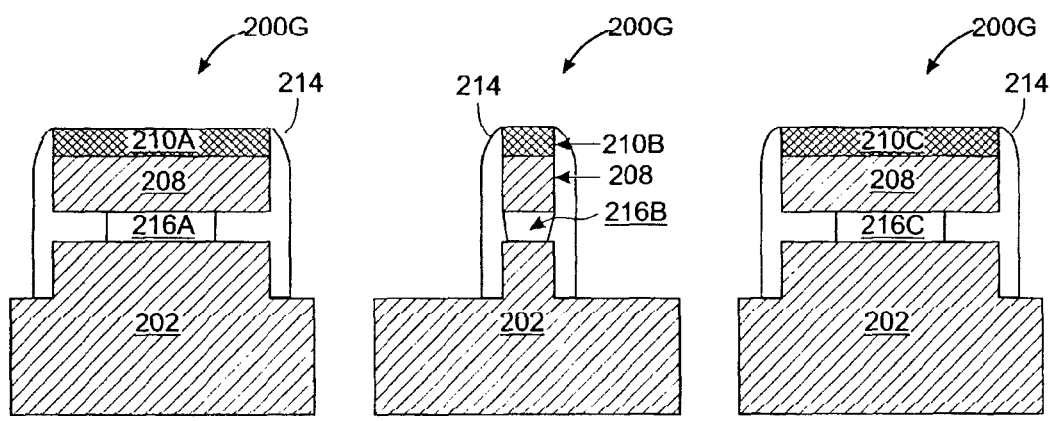
SECTION A-A'
FIG. 2U
SECTION B-B'
FIG. 2V
SECTION C-C'
FIG. 2W

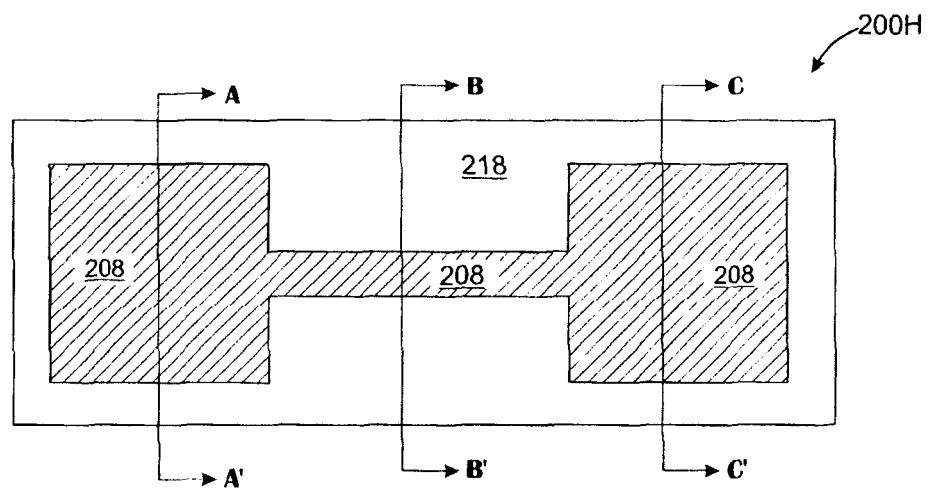
FIG. 2X
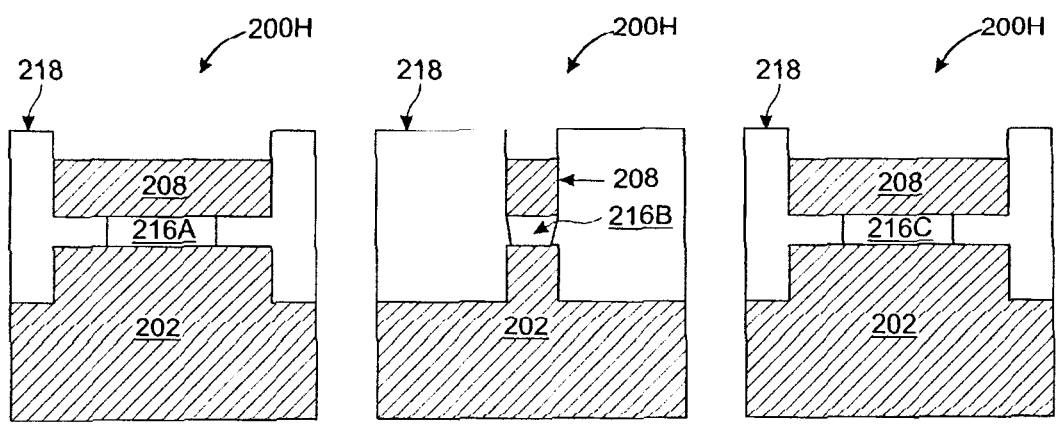
SECTION A-A'
FIG. 2Y
SECTION B-B'
FIG. 2Z
SECTION C-C'
FIG. 2AA

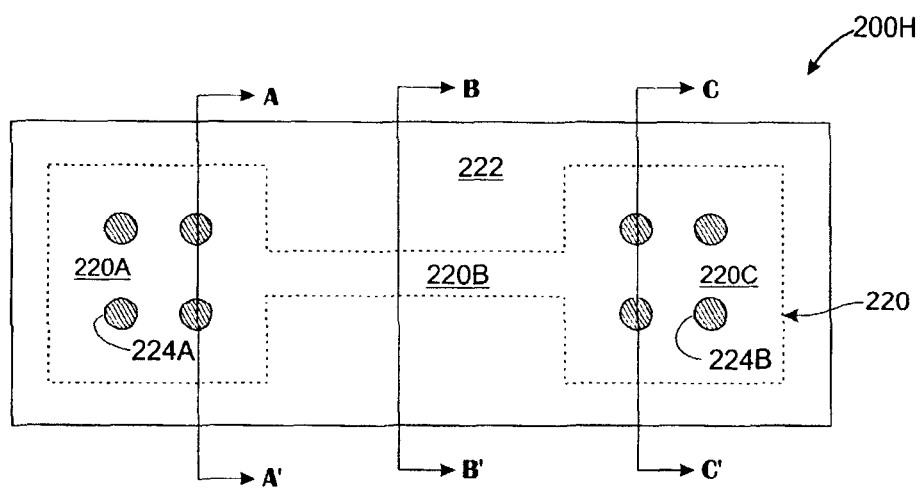
FIG. 2BB
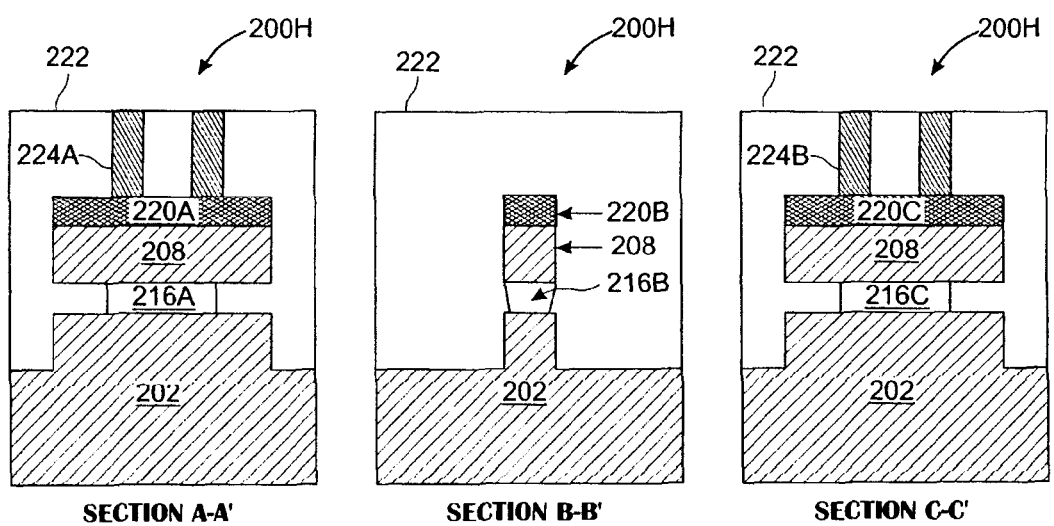
SECTION A-A'
FIG. 2CC
SECTION B-B'
FIG. 2DD
SECTION C-C'
FIG. 2EE

SINGLE CRYSTAL FUSE ON AIR IN BULK SILICON

TECHNICAL FIELD

The present invention relates to the formation of structures in semiconductor devices, and more particularly to the formation of electronic fuse (eFUSE) elements on semiconductor devices.

BACKGROUND ART

Integrated fuse devices have been employed in semiconductor integrated circuits for many years for a wide variety of purposes. The main purpose of a fuse device is to act a conductive pathway until it is "blown".

Historically, integrated fuse devices have involved patterned metal conductive links that can be selectively "blown" or cut with a laser beam or by passing a large current through them. This process causes a portion of the link material to vaporize and a portion to melt, in much the same manner as an automotive fuse, but on a much smaller scale. Once blown the fuse changes from a highly conductive state to a highly resistive (i.e., non-conductive) state.

A blown fuse inhibits current from flowing through and represents an open circuit to the current path. However, if the conductive fuse link material is not sufficiently dispersed within the surrounding area, conductive debris or "fallout" from the "blow" process may still represent a conductive path even after the fuse device is blown. In other words, especially with electrically blown fuses, the fuse "blow" may sometimes be unreliable. To deal with this possibility, cavities or areas of adsorption material are often provided around the fuse link material to provide a harmless place for the melted and vaporized material to disperse. U.S. Pat. No. 5,903,041 by Fleur, et al. (hereinafter "FLEUR") is an example of such a technique. FLEUR describes a two-terminal fuse-antifuse device with an air gap for receiving debris from the "blow" process, and for thermally isolating the fuse-antifuse from BEOL (back end of line) dielectrics. The thermal isolation of FLEUR helps to prevent heat transfer to the BEOL dielectrics during the "blow" process, thereby limiting stress.

Generally speaking, the "blown" condition of a fuse device is permanent and irreversible —and is intended as such. Integrated fuse devices are inherently "nonvolatile," that is, their condition is not lost when the integrated circuit is powered down. This nonvolatile characteristic was employed in one of the earlier applications of integrated fuse devices: the fusible link PROM (programmable read only memory) in which the blown and un-blown conditions of the individual fuse devices in an array were used to represent the individual one and zero states stored in a user programmable memory device.

One notable variation on the theme of fuse devices is the "antifuse" that performs the opposite function of a fuse. An antifuse is a normally open device that can be irreversibly "un-blown" to become conductive. Whereas a fuse starts with a low resistance and is designed to permanently break an electrically conductive path, an antifuse starts with a high resistance and is designed to permanently create an electrically conductive path. ICs that use antifuse technology often employ a thin barrier of non-conducting amorphous silicon between two metal conductors. When a sufficiently high voltage is applied across the amorphous silicon it is turned into a polycrystalline silicon-metal alloy (silicide) with a low resistance, thereby forming a conductive link.

The conductive pathway provided by an "un-blown" fuse device can be employed in almost any way a "normal" conductor can be employed: to carry power to a circuit; to provide a bypass connection around a circuit or to connect one area of circuitry to another; to provide "hard" logic levels (e.g., the aforementioned PROM application); and many other ways.

Electronic systems often require functions to be enabled, disabled or modified after semiconductor chips used in the electronic systems have been manufactured. For example, a common chip may be designed to serve multiple applications, the chip originally having circuitry to support all of the multiple applications. After manufacture of the chip, integrated fuse devices can be blown to personalize the chip for a particular specific application.

By way of further example, integrated circuit chips will sometimes contain imperfections that render portions of the chip unusable. A computer processor chip may be designed to have a 128 KB (kilobyte) cache, but in-process testing may determine that only 64 KB of the 128 KB is functional. If the remainder of the chip is functional, the chip may still be used, but information must be stored on the chip so that no attempt to use the nonfunctional 64 KB portion of the 128 KB cache is performed.

In yet another example, static charges built up during certain processing steps in the fabrication and processing of dynamic random access memory (DRAM) circuits put sensitive transistor gate stacks at risk of damage. To protect the gate stacks, one or more integrated fuse devices may be employed during manufacturing to create protective current pathways that conduct these charges harmlessly away. At a later point in the fabrication process when the risk of damage no longer exists, the fuses can be blown or cut to permit the finished DRAM circuit to function normally.

One approach to dealing with yield problems in large arrays is the use of redundant circuit elements. Redundancy has been employed on memory chips for many years in order to increase yield. When a defective cell (or collection of cells) is identified through chip testing, its address is typically recorded in nonvolatile memory. This non-volatile memory is typically implemented as an array of laser-blown fuses on the chip. Subsequently, whenever the defective address is accessed, the fuses and associated redundancy logic cause redundant cells to be accessed instead of the defective cells. As integration density has increased, the use of this kind of redundancy logic with large static arrays has become commonplace in advanced chip designs. On some recent integrated circuit designs, memory has been integrated with logic to such an extent that redundancy involving hundreds or thousands of fuse devices has been employed to ensure adequate chip yield. Some of these chips have also employed fuse devices to provide electronic chip ID, or EID.

A more recent development in integrated fuse technology is the "eFUSE" device, in which "blowing" the fuse does not involve a physical rupture of a fuse element, but where a silicide conductive element is caused to thin out or disperse by electromigration, greatly increasing its resistance. The fuse is "blown" by applying a higher than nominal voltage. eFUSE devices provide several compelling advantages over the laser fuses they have replaced. The blow process does not risk damage to adjacent devices. eFUSEs can be blown by a logic process instead of a physical laser ablation method. eFUSEs are substantially smaller than laser fuses, and they scale better with process improvements. Finally, since no specialized equipment or separate product flow is required, eFUSEs can be blown at multiple test and application stages. We discuss circuit design, fuse programming, test considerations, and z9e system applications. The physical and logical implementation of eFUSEs has resulted in improved yield at wafer, module, and final assembly test levels, and has provided additional flexibility in logic function and in system use.

On modern semiconductor chips, fuse devices are often provided in the form of "eFUSEs" or electronically programmable fuses. As a fuse device, an eFUSE is electronically programmable, and may be programmed by blowing the eFUSE after a chip is manufactured. In some applications, the eFUSE is blown even after an electronic system utilizing the chip has been in operation for some time.

An eFUSE typically comprises a silicide conductive link on a silicon or polysilicon beam. Silicide has been widely used in semiconductor products to provide low-resistance conductors, typically in the gate, source or drain regions of integrated Field Effect Transistors (FETs). An eFUSE is blown by directing a current of sufficient magnitude and duration through the eFUSE to cause diffusion of the silicide material by electromigration. This effectively "thins" the silicide concentration in the conductive link, thereby increasing its electrical resistance. Descriptions of eFUSEs can be found in U.S. Pat. No. 6,368,902, "Enhanced eFUSEs by the local degradation of the fuse link", by Chandrasekharan Kothandaraman, et al (hereinafter referred to as "KOTHANDARAMAN 902"), and U.S. Pat. No. 6,624,499, "System for programming fuse structure by electromigration of silicide enhanced by creating temperature gradient", by Chandrasekharan Kothandaraman, et al. (hereinafter referred to as "KOTHANDARAMAN 499"), both of which are incorporated herein by reference.

Integrated eFUSE devices have several advantages over conventional integrated fuse devices. The electromigration programming technique employed with eFUSE devices does not produce vaporized or molten "fallout," resulting in minimal risk of damage to adjacent structures. As a result, eFUSE density can be quite high compared to conventional metallic fusible links. Further, eFUSEs can be blown using considerably less energy than conventional fuses, and require less thermal isolation.

eFUSE programming by silicide electromigration is dependent upon the diffusion of silicide, which is greatly dependent upon temperature. Present eFUSE devices typically lie on STI (shallow trench isolation) oxide, which provides reasonably good thermal isolation of the fuse device (compared to other materials in the chip), but which is still thermally conductive enough to present challenging tradeoffs in choosing the appropriate amount of thermal energy to use in blowing the EFUSE. While thermal isolation is less critical for eFUSE devices than for conventional fusible links, the amount of energy required to raise the temperature of the eFUSE silicide to cause predictable, reliable electromigration depends greatly upon the thermal conductivity of the materials on which the eFUSE is built.

SUMMARY OF THE INVENTION

It is therefore an object of the present inventive technique to provide an integrated eFUSE device compatible with FEOL (front end of the line) processes.

It is a further object of the present invention to provide an integrated eFUSE device that produces an improved temperature gradient (for purposes of electromigration) compared to prior-art eFUSE devices.

It is a further object of the present invention to improve programming speed of integrated eFUSE devices.

It is a further object of the present invention to produce an integrated eFUSE device that requires reduced programming current and smaller programming transistors than prior-art eFUSE devices.

It is a further object of the present invention to reduce heat transfer from the eFUSE device into surrounding structures during programming.

It is a further object of the present invention to improve predictability of electromigration in programming eFUSE devices.

According to the invention, an integrated eFUSE device is formed by creating a silicon "floating beam" on air, whereupon the fusible portion of the eFUSE device resides. This beam extends between two larger, supporting terminal structures. "Undercutting" techniques are employed whereby a structure is formed atop a buried layer, and that buried layer is removed by selective etching. In-process mechanical support for the floating beam can be provided either by creating a surrounding buttressing support structure or by controlling the selective etch process such that some areas are not fully undercut, leaving supporting "pillars" behind. In either case, a "floating" silicide eFUSE conductor is formed on a silicon beam structure. In its initial state, the eFUSE silicide is highly conductive, exhibiting low electrical resistance (the "unblown" state of the eFUSE). When a sufficiently large current is passed through the eFUSE conductor, localized heating occurs. This heating causes electromigration of the silicide into the silicon beam (and into surrounding silicon, thereby diffusing the silicide and greatly increasing its electrical resistance. When the current source is removed, the silicide remains permanently in this diffused state, the "blown" state of the eFUSE.

According to an aspect of the invention, the integrated floating-beam eFUSE device is characterized by a raised silicon structure, having a beam portion joining two spaced-apart terminal portions. Silicide formed on top of the raised silicon structure, and extends across the beam portion. A space underlies the beam portion. Typically air fills the space but it could be just any suitable/convenient gaseous (or vacuum) environment. The two terminal portions are supported by underlying "pillar" structures and/or by surrounding oxide/ dielectric.

Preferably, the raised silicon structure is single-crystal silicon, which provides more predictable electromigration than polysilicon, due to the grain boundaries in polysilicon.

The silicide on the beam portion initially creates a low-resistance conductive pathway between silicide on the two terminal portions in an initial "unblown" state of the eFUSE device. Subsequent application of energy to the silicide in the beam portion (e.g., by passing a current through it), causes electromigration of silicide on the beam portion into the underlying silicon, producing a high-resistance pathway between silicide on the two terminal portions in a subsequent "blown" state of the eFUSE device.

Typically, a dielectric material overlies and surrounds the eFUSE structure without filling the air gap under the beam portion, and contact structures extending through the overlying dielectric form electrical contact with silicide on the two terminal portions.

According to the invention, one technique for forming the inventive integrated eFUSE device by providing a silicon die having a buried implantation layer overlying a base silicon layer. Next an overlying silicon layer (preferably single-crystal silicon) is formed above the implantation layer. A cap layer (preferably nitride) is formed on the overlying layer. A patterned etch is then performed to leave behind a raised structure having two spaced-apart terminal portions joined by a narrow beam portion. The etch process proceeds downward substantially through the overlying silicon layer to the implantation layer. A selective etching process specific to the implantation layer then undercut and form a void under the narrow beam portion while leaving behind supporting pillars under the terminal portions. Next, an oxide fill is formed to provide mechanical support for the two terminal portions, enclosing but not filling the air gap under the beam portion. Next, the cap layer is exposed and stripped from the raised structure to expose underlying silicon. Silicide is then formed atop the silicon exposed by stripping the cap layer. The silicide on the beam portion is the "fusible" portion of the eFUSE.

The buried implantation layer can be formed by performing a blanket implantation of an n+ dopant (preferably, P, As or Sb), then performing a spike anneal.

According to another aspect of the invention, an integrated eFUSE can be formed by a somewhat different process, starting as before with a silicon die having a buried implantation layer overlying a base silicon layer. An overlying silicon layer is formed above the implantation layer and a cap layer (preferably nitride) is formed on the overlying layer. A patterned etch is then performed to leave behind a raised structure having two spaced-apart terminal portions joined by a narrow beam portion. The etch process proceeds downward through the implantation layer into the base silicon layer, such that the raised structure has exposed portions of the implantation layer on its side walls. Next, a short lateral etch selective to the implantation layer is performed to undercut and form a air gap under the narrow beam portion while leaving behind supporting portions of the implantation layer under the terminal portions.

A layer of oxide is disposed over and around the raised structure, followed by a masked etch to remove all of this oxide except a pair of supporting oxide "brackets" that provide mechanical support for the two terminal portions. Remaining portions of the implantation layer under the terminal portions are then etched away. A protective oxide spacer is formed around the sides of the raised structure such that the spacer material encloses the air gap under the beam portion without filling it. Next, a planarizing oxide fill is provided such that the cap layer is exposed. The cap layer is then stripped to underlying silicon and silicide is formed atop the silicon exposed by stripping the cap layer.

According to an aspect of the invention, in the course of processing, the oxide spacer incorporates said previously formed oxide brackets and said oxide fill incorporates said previously formed oxide spacer.

Other objects, features and advantages of the inventive technique will become evident in light of the ensuing description thereof.

BRIEF DESCRIPTION OF THE DRAWINGS

These and further features of the present invention will be apparent with reference to the following description and drawing, wherein:

FIG. 1C is a top view of the semiconductor die of FIG. 1B after a third processing stage, in accordance with the invention.

FIGS. 1D-1F are cross-sectional views of the semiconductor die of FIG. 1C.

FIG. 1G is a top view of the semiconductor die of FIG. 1C after a fourth processing stage, in accordance with the invention.

FIGS. 1H-1J are cross-sectional views of the semiconductor die of FIG. 1G.

FIG. 1K is a top view of the semiconductor die of FIG. 1G after a fifth processing stage, in accordance with the invention.

FIGS. 1L-1N are cross-sectional views of the semiconductor die of FIG. 1K.

FIG. 1P is a top view of the semiconductor die of FIG. 1K after a sixth processing stage, in accordance with the invention.

FIGS. 1Q-1S are cross-sectional views of the semiconductor die of FIG. 1P.

FIG. 1T is a top view of the semiconductor die of FIG. 1P after a seventh processing stage, in accordance with the invention.

FIGS. 1U-1W are cross-sectional views of the semiconductor die of FIG. 1T.

FIG. 2C is a top view of the semiconductor die of FIG. 2B at a third processing stage, in accordance with the invention.

FIGS. 2D-2F are cross-sectional views of the semiconductor die of FIG. 2C.

FIG. 2G is a top view of the semiconductor die of FIG. 2C at a Fourth processing stage, in accordance with the invention.

FIGS. 2H-2J are cross-sectional views of the semiconductor die of FIG. 2G.

FIG. 2K is a top view of the semiconductor die of FIG. 2G at a fifth processing stage, in accordance with the invention.

FIGS. 2L-2N are cross-sectional views of the semiconductor die of FIG. 2K.

FIG. 2P is a top view of the semiconductor die of FIG. 2K at a sixth processing stage, in accordance with the invention.

FIGS. 2Q-2S are cross-sectional views of the semiconductor die of FIG. 2P.

FIG. 2T is a top view of the semiconductor die of FIG. 2P at a seventh processing stage, in accordance with the invention.

FIGS. 2U-2W are cross-sectional views of the semiconductor die of FIG. 2T.

FIG. 2X is a top view of the semiconductor die of FIG. 2T at an eighth processing stage, in accordance with the invention.

FIGS. 2Y-2AA are cross-sectional views of the semiconductor die of FIG. 2X.

FIG. 2BB is a top view of the semiconductor die of FIG. 2X at a ninth processing stage, in accordance with the invention.

FIGS. 2CC-2EE are cross-sectional views of the semiconductor die of FIG. 2BB.

DETAILED DESCRIPTION OF THE INVENTION

Figure 1A:
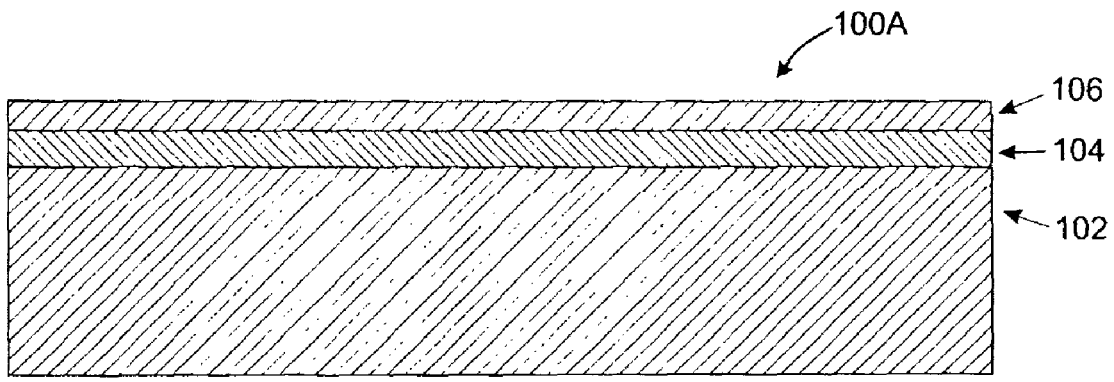
FIG. 1A is a cross-sectional view of a semiconductor die at a first stage in the formation of an eFUSE device, in accordance with the invention.

The present inventive technique creates a "floating beam" eFUSE structure whereby an air gap or void is created under a fusible portion of an eFUSE. Typically air fills the space, but it could be just any suitable/convenient gaseous (or vacuum) environment. For example, "undercutting" techniques may be employed whereby a structure is formed atop a buried layer, and that buried layer is removed by selective etching. In-process mechanical support for the floating beam can be provided either by creating a surrounding buttressing support structure or by controlling the selective etch process such that some areas are not fully undercut, leaving supporting "pillars" behind. In either case, a "floating" silicide eFUSE conductor is formed on a silicon beam structure. In its initial state, the eFUSE silicide is highly conductive, exhibiting low electrical resistance (the "unblown state of the eFUSE). When a sufficiently large current is passed through the eFUSE conductor, localized heating occurs. This heating causes electromigration of the silicide into the silicon beam (and into surrounding silicon, thereby diffusing the silicide and greatly increasing its electrical resistance. When the current source is removed, the silicide remains permanently in this diffused state, the "blown" state of the eFUSE.

Conventional fuse devices are formed at the time of metallization in BEOL (back end of the line) processing. By way of contrast, the formation of the floating eFUSE device of the present invention is compatible with FEOL (front end of the line) processing, when transistor bodies are typically being formed.

The present inventive eFUSE structure is characterized by a "floating beam" structure wherein a top-silicided silicon beam overlies an air-gap or void. Preferably, the beam is narrow compared to surrounding structures supporting it, and consequently has relatively low thermal mass. Even further, the beam is both physically and thermally decoupled from the bulk of the silicon die by the air gap or void underlying it. By passing a current through the silicide on top of the beam, a relatively rapid temperature rises occurs, while the temperatures of the surrounding structures are only minimally affected due to their relatively greater thermal mass. This means that the floating beam eFUSE structure is capable of creating a greater thermal gradient than would be possible without the air gap or void. Without the air gap or void, the eFUSE would have been formed on an isolating oxide, which provides reasonably good thermal isolation from neighboring devices, but still present some thermal coupling to the remainder of the die on which the eFUSE resides.

This thermal decoupling enables rapid temperature rise and lowers the amount of energy (in the form of current) required to cause electromigration of the silicide. As a result, programming speed is improved and smaller programming transistors can be employed.

A first embodiment of the present inventive technique is described hereinbelow with respect to FIGS. 1A-1W. In this embodiment, a buried implantation layer is created. A raised structure having two large areas joined by a thin "beam" is created. A selective etch is used to completely undercut the beam by removing the buried implantation layer, but the process is stopped before completely undercutting the two large areas. This leaves supporting "pillars" under the large areas, with the beam area forming a raised bridge between them. In combination with other processing, this forms an eFUSE structure overlying an air gap or void.

FIG. 1A is a cross-sectional view of a semiconductor die 100A at a first stage in the formation of an eFUSE device, wherein a buried n+ implantation profile has been created. An underlying silicon layer 102, an n+ implantation layer 104 and an overlying silicon layer 106 with low dopant concentration characterize the buried implantation profile. The low dopant concentration promotes good epitaxial growth in subsequent processing. The blanket n+ implant can be formed, for example by doping with P, As or Sb followed by a spike anneal.

Figure 1B:
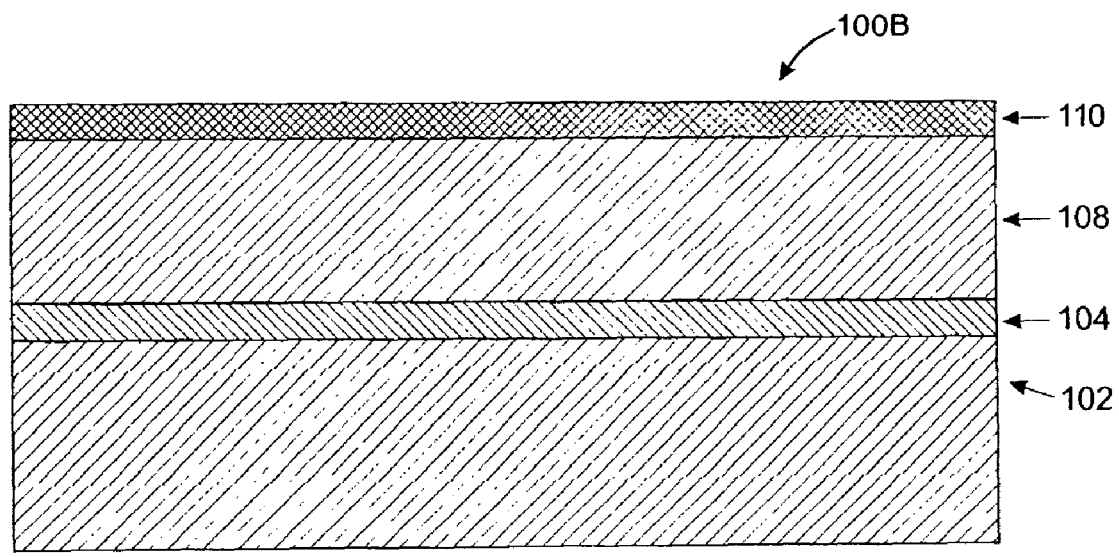
FIG. 1B is a cross-sectional view of the semiconductor die of FIG. 1A at a second processing stage in the formation of an eFUSE device, in accordance with the invention.

FIG. 1B is a cross-sectional view of a semiconductor die 100B representing the semiconductor die 100A of FIG. 1A at a second processing stage in the formation of an eFUSE device, wherein a layer of silicon layer 108 has been formed (e.g., by epitaxial growth of 50-100 nm thick silicon), and a pad layer 110 of nitride has been formed on top of pad oxide layer (not shown), which is on top of silicon layer (epi) 108.

FIG. 1C is a top view of a semiconductor die 100C representing the semiconductor die 100B of FIG. 1B at a third processing stage, after performing a patterned etch. This patterned etch can be performed as part of STI (shallow trench isolation) formation, e.g., by STI lithographic resist patterning, RIE (reactive ion etching) and stripping of the resist. This process defines the general shape of what will become the eFUSE structure. The patterned etch cuts down through the pad layer 110 and substantially through the epi silicon layer 108 to form a raised structure characterized in this top view by two large pad areas 110A and 110C joined by a relatively thinner "beam" area 110B.

FIGS. 1D-1F are cross-sectional views of the semiconductor die of FIG. 1C taken through section lines A-A', B-B' and C-C', respectively. FIG. 1D represents a sectional view through one of the larger "pad" areas showing how the epi silicon layer 108 in this area and its overlying pad layer 110 have been formed into a relatively wide structure 110A, bounded by an etched away area 108A. Similarly, FIG. 1F represents a sectional view through the other large pad area (110C) showing a relatively wide structure 110C bounded by etched-away area 108C. FIG. 1E represents a cross-sectional view of the relatively thinner "beam" area 110B, revealing a relatively thin raised structure at this point (110B) bounded by etched-aware area 108B (108B in FIG. 1E is marked as 108A).

FIG. 1G is a top view of a semiconductor die 100D representing the semiconductor die 100C of FIG. 1C at a fourth processing stage, wherein an "undercutting" process has been used to create a floating "beam" out of the thin raised beam section 10B. FIGS. 1H, 1I and 1J are cross-sectional views of the semiconductor die 100D of FIG. 1G taken through section lines A-A', B-B' and C-C', respectively. Viewing FIGS. 1G, 1H, 1I and 1J simultaneously, a protective oxide spacer 112 is first formed over side walls of the raised structure (areas 110A, 110B and 110C), followed by an etch process selective to the blanket n+ implant region 104. The selective etch process is controlled (e.g., timed) such that it completely undercuts the implant region 104 under the thin beam area 110B to form a gap 116 thereunder, but stops before completely undercutting the larger pad areas 110A and 110C, leaving them supported on "pillars" 114A and 114B. At this point, the thin area 110B has effectively become a floating beam structure overlying an air gap or void 116.

FIG. 1K is a top view of a semiconductor die 100E representing the semiconductor die 100D of FIG. 1G at a fifth processing stage, after performing an oxide fill and planarization step. FIGS. 1L, 1M and 1N are cross-sectional views of the semiconductor die 100E of FIG. 1K taken through section lines A-A', B-B' and C-C', respectively. As shown in FIGS. 1K-1N, this process deposits an oxide fill material 118 (e.g., SiO2) that surrounds the raised structures (110A, 110B, 110C) but does not substantially intrude into the undercut areas beneath them. Note that the protective oxide spacer 112 becomes incorporated into the oxide fill material 118. This oxide fill 118 mechanically stabilizes raised structures 110A, 110B, 110C but leaves the air gap or void 116 intact.

FIG. 1P is a top view of a semiconductor die 110F representing the semiconductor die 100E of FIG. 1K at a sixth processing stage, wherein the pad layer 110 has been stripped and a silicide layer 120 has been formed in its place atop the epi silicon layer 108. FIGS. 1Q, 1R and 1S are cross-sectional views of the semiconductor die 100F of FIG. 1P taken through section lines A-A', B-B' and C-C', respectively. As shown in FIGS. 1P-1S, this silicide layer is characterized by two larger regions 120A and 120C connected by a thinner beam 120B. This silicide beam 120B becomes the fusible conductor portion of the eFUSE.

FIG. 1T is a top view of a semiconductor die 100G representing the semiconductor die 100F of FIG. 1P at a seventh processing stage, wherein a MOL (middle of line) dielectric layer 122 has been deposited and planarized, and contacts 124A and 124B have been formed. FIGS. 1U, 1V and 1W are cross-sectional views of the semiconductor die 100G of FIG. 1T taken through section lines A-A', B-B' and C-C', respectively. As shown in FIGS. 1T-1W, contacts 124A have been formed through the dielectric layer 122 into one larger silicide region 120A, and contacts 124B have been formed through the dielectric layer 122 into the other larger silicide region 120B. Contacts 124A and 124B, therefore, provide electrical connectivity to opposite ends of the silicide "beam" portion 120B.

When a sufficiently large current is passed through the silicide beam 120B by means of contacts 124A and 124B, the thinner beam region heats up, causing electromigration of the silicide into the underlying silicon. This electromigrates the silicide and greatly reduces its electrical conductivity. The relatively thick silicon layer 108 provides room for the electromigrated silicide to go, while the underlying void (air gap) 116 helps to thermally isolate the thin beam area from surrounding structures, permitting a higher thermal gradient. This reduces the amount of energy required to accomplish electromigration and reduces the physical size of the drive transistor(s) required to program the eFUSE.

A second embodiment of the present inventive technique is described hereinbelow with respect to FIGS. 2A-2EE. In this second embodiment, a buried implantation layer is created in much the same manner as in the first embodiment. A similar raised structure having two large areas joined by a thin "beam" is created. In this embodiment, however, oxide "brackets" are formed to support the two large areas. The buried layer is completely removed, with the oxide "brackets" providing in-process support. A stabilizing oxide fill is then deposited around the raised structure. As before, this process in combination with other processing forms an eFUSE structure overlying an air gap or void.

Figure 2A:
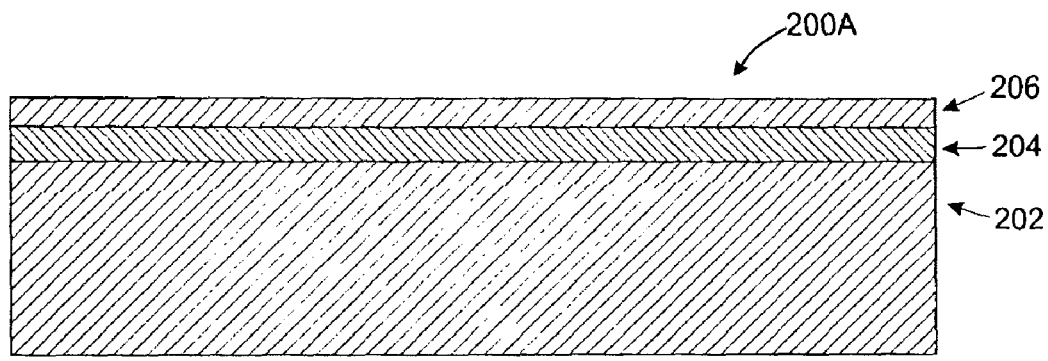
FIG. 2A is a cross-sectional view of a semiconductor die at a first stage in the formation of another embodiment of an eFUSE device, in accordance with the invention.

FIG. 2A is a cross-sectional view of a semiconductor die 200A at a first stage in the formation of an eFUSE device, wherein a buried n+ implantation profile has been created (compare FIG. 1A). An underlying silicon layer 202, an n+ implantation layer 204 and an overlying silicon layer 206 with low dopant concentration characterize the buried implantation profile. The low dopant concentration promotes good epitaxial growth in subsequent processing. The blanket n+ implant can be formed, for example by doping with P, As or Sb followed by a spike anneal.

Figure 2B:
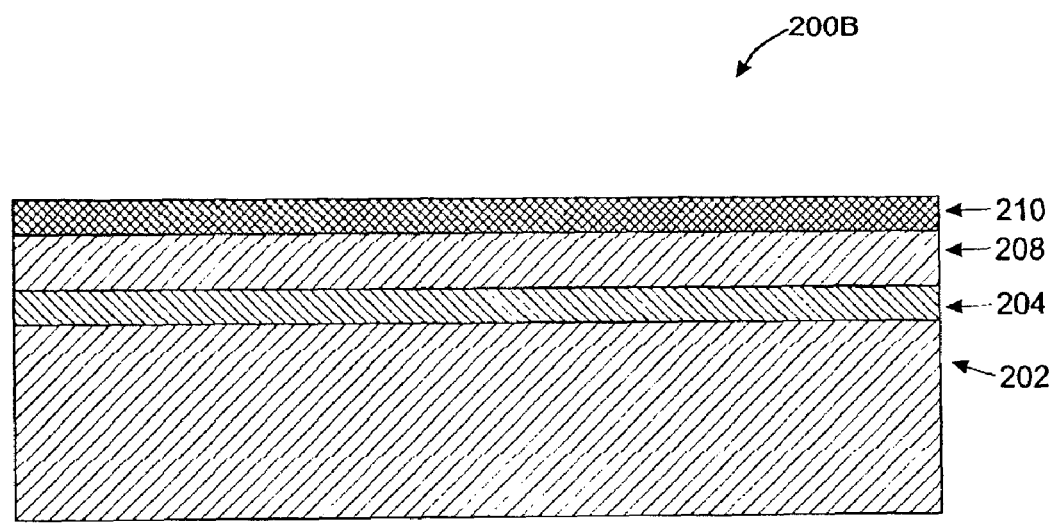
FIG. 2B is a cross-sectional view of the semiconductor die of FIG. 2A at a second processing stage in the formation of an eFUSE device, in accordance with the invention.

FIG. 2B is a cross-sectional view of a semiconductor die 200B representing the semiconductor die 200A of FIG. 2A at a second processing stage in the formation of an eFUSE device, wherein a layer of silicon layer 208 has been formed (e.g., by epitaxial growth of 50-100 nm thick silicon), and a pad layer 210 of nitride has been formed on top of pad oxide (not shown), which is on top of silicon layer (epi) 208.

FIG. 2C is a top view of a semiconductor die 200C representing the semiconductor die 200B of FIG. 2B at a third processing stage, after performing a patterned etch. This patterned etch can be performed as part of STI (shallow trench isolation) formation, e.g., by STI lithographic resist patterning, RIE (reactive ion etching) and stripping of the resist. This process defines the general shape of what will become the eFUSE structure. Unlike the first embodiment shown and described hereinabove, the patterned etch cuts completely through the pad layer 210, the epi layer 208, the buried n+ implantation layer 204 and into the underlying silicon layer 202. Much the same as in the first embodiment, this forms a raised structure characterized in this top view by two large pad areas 210A and 210C joined by a relatively thinner "beam" area 210B.

FIGS. 2D-2F are cross-sectional views of the semiconductor die of FIG. 2C taken through section lines A-A', B-B' and C-C', respectively. FIG. 2D represents a sectional view through one of the larger "pad" areas showing how the pad layer 210, epi silicon layer 208, buried layer 204 and part of the underlying silicon layer 202 in this area have been formed into a relatively wide structure 210. Similarly, FIG. 2F represents a sectional view through the other large pad area (210C) showing a relatively wide structure 210C. FIG. 2E represents a cross-sectional view of the relatively thinner "beam" area 210B, revealing a relatively thin raised structure at this point (210B).

FIG. 2G is a top view of a semiconductor die 200D representing the semiconductor die 200C of FIG. 2C at a fourth processing stage, wherein an "undercutting" process has been used to create a floating "beam" out of the thin raised beam section 210B. FIGS. 2H, 2I and 2J are cross-sectional views of the semiconductor die 200D of FIG. 2G taken through section lines A-A', B-B' and C-C', respectively. Viewing FIGS. 2G, 2H, 2I and 2J simultaneously, a short lateral RIE process is used to cut into the implantation layer 204. This process completely undercuts the beam area 210B leaving an air gap or void 204A, but leaves "pillars" supporting the larger areas 210A and 210C. This is followed by a non-directional surface deposition of an oxide fill 212 that completely coats around the raised structure (210A, 210B and 210C) and extends into and fills the undercut areas.

FIG. 2K is a top view of a semiconductor die 200E representing the semiconductor die 200D of FIG. 2G at a fifth processing stage, after performing a masked etch of the oxide fill 212 to form oxide support "brackets" 212A and 212B supporting a portion of each of the two larger areas 210A and 210C of the raised structure. FIGS. 2L, 2M and 2N are cross-sectional views of the semiconductor die 200E of FIG. 2K taken through section lines A-A', B-B' and C-C', respectively. FIG. 2L is a cross section taken through line A-A', away from the "bracket" 212A, showing that a portion of the implantation layer 204 remains. FIG. 2N is a cross-sectional view taken through the oxide "bracket" 212B, showing how it surrounds and supports the larger portion of the raised structure. FIG. 2M shows that with the removal of the oxide fill material 212 underlying the narrower beam portion 210B of the raised structure, a complete void 204A remains.

FIG. 2P is a top view of a semiconductor die 210F representing the semiconductor die 200E of FIG. 2K at a sixth processing stage after a selective etch. FIGS. 2Q, 2R and 2S are cross-sectional views of the semiconductor die 200F of FIG. 2P taken through section lines A-A', B-B' and C-C', respectively. As shown in FIGS. 2P-2S, the selective etch process has completely removed the remaining portions of the implantation layer 204, leaving the larger areas (210A, 210C) of the raised structure supported only by the oxide "brackets" 212A and 212B, and the beam portion 210B "floating" above the void 204A.

FIG. 2T is a top view of a semiconductor die 200G representing the semiconductor die 200F of FIG. 2P at a seventh processing stage. FIGS. 2U, 2V and 2W are cross-sectional views of the semiconductor die 200G of FIG. 2T taken through section lines A-A', B-B' and C-C', respectively. As shown in FIGS. 2T-2W, an oxide spacer 214 has been formed over the walls of the raised structure. This spacer 214 incorporates the "brackets" 212A and 212B, but does not extend substantially into the undercut regions, which remain as voids 216A, 216B and 216B underlying a completely detached eFUSE structure, supported only by oxide.

FIG. 2X is a top view of a semiconductor die 200H representing the semiconductor die 200G of FIG. 2T at an eighth processing stage. FIGS. 2Y-2AA are cross-sectional views of the semiconductor die 200H of FIG. 2X taken through section lines A-A', B-B' and C-C' respectively. Viewing FIGS. 2X, 2Y, 2Z and 2AA simultaneously, at this stage of processing an STI fill process, CMP (chem.-mech polish) planarization have been performed and the pad layer 210 has been stripped to reveal the epi silicon layer 208. STI oxide fill 218 incorporates the previously deposited oxide spacer 214.

FIG. 2BB is a top view of a semiconductor die 200I representing the semiconductor die 200H of FIG. 2X at an ninth processing stage. FIGS. 2CC-2EE are cross-sectional views of the semiconductor die of 200I FIG. 2BB taken through section lines A-A', B-B' and C-C', respectively. Viewing FIGS. 2BB-2EE in combination, a silicide layer 220 (comprising large terminal portions 220A and 220C and a narrow beam portion 220B joining them) has been formed atop the epi silicon layer 208. Next, a MOL dielectric layer 222 has been deposited and planarized, incorporating the previously deposited oxide structures. Finally, contacts 224A and 224B have been formed through the dielectric layer 222 into the terminal silicide portions 220A and 220C, respectively, providing electrical connectivity thereto.

The eFUSE described in this second embodiment operates in essentially the same manner as the eFUSE of the first embodiment, such that when a sufficiently large current is passed through the silicide beam 220B by means of contacts 224A and 224B, the thinner beam region heats up, causing electromigration of the silicide into the underlying silicon. This electromigrates the silicide and greatly reduces its electrical conductivity. The relatively thick silicon layer 208 provides room for the electromigrated silicide to go, while the underlying void (air gap) 116 helps to thermally isolate the thin beam area from surrounding structures, permitting a higher thermal gradient. This reduces the amount of energy required to accomplish electromigration and reduces the physical size of the drive transistor(s) required to program the eFUSE.

One significant aspect of the present inventive technique is that the floating beam eFUSE employs single crystal, epitaxially-grown silicon. Typically, eFUSEs are silicided polysilicon. The polysilicon has a great deal of variation in its properties (e.g., rate of silicide diffusion) due to its grain boundaries. By way of contrast, single crystal silicon is more predictable, yielding more predictable electromigration. This improves reliability and simplifies design.

Another benefit of the present inventive technique comes from the use of a void. While eFUSE devices do not "blow" explosively to form vapors and molten materials, if a fault should occur that would cause rupture of the eFUSE beam, the void provides a place for the debris to go, thereby protecting the remainder of the die from damage.

Still another benefit of the present inventive technique is that the thickness of the crystalline silicon beam can be controlled independently of other structures (by controlling the height of the epitaxially grown layer from which it is formed).

According to another aspect of the present inventive technique, the thickness of the single crystal silicon "beam" can be controlled independent of other process parameters, allowing for a thicker silicon beam. A thicker beam has been shown experimentally to provide more room for the electromigrated silicide, thereby permitting greater diffusion of the silicide during the electromigration "blow" process. This increases the difference in conductivity between the eFUSE's "blown" and "unblown" states, providing improved eFUSE predictability and reliability.

It will be immediately evident to those of ordinary skill in the art that there are many processing techniques by which a floating beam structure can be formed. The two embodiments described hereinabove are intended to be exemplary of these many possible techniques, and are not intended to be limiting. It is anticipated that other techniques would be useful to produce a floating beam eFUSE structure as described herein, and it is fully within the spirit and scope of the present invention to do so.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described inventive components the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. An integrated floating-beam eFUSE device, comprising:
   a raised silicon structure, said structure comprising a beam portion joining two spaced-apart terminal portions;
   silicide formed on a top surface of the raised silicon structure, said silicide extending across the beam portion;
   an air gap underlying the beam portion; and
   an oxide fill material surrounding the raised structure, substantially without intruding into undercut areas beneath the raised structure, for stabilizing the raised structure while leaving the air gap substantially intact.

2. An eFUSE device according to claim 1, wherein the raised silicon structure is single-crystal epitaxially grown silicon.

3. An eFUSE device according to claim 1, wherein the silicide on the beam portion initially creates a low-resistance conductive pathway between silicide on the two terminal portions in an initial "unblown" state of the eFUSE device.

4. An eFUSE device according to claim 3, wherein electromigration of silicide on the beam portion into the raised silicon structure produces a high-resistance pathway between silicide on the two terminal portions in a subsequent "blown" state of the eFUSE device.

5. An eFUSE device according to claim 1, wherein said terminal portions are completely supported by a surrounding dielectric material.

6. An eFUSE device according to claim 5, wherein the dielectric material is silicon dioxide.

7. An eFUSE device according to claim 1, wherein said terminal portions are partially supported by an underlying doped implantation layer.

8. An eFUSE device according to claim 1, further comprising:
   an overlying dielectric material; and
   contact structures extending through the overlying dielectric to form electrical contact with silicide on the two terminal portions.

* * * * *